United States Patent [19]
Ali et al.

[11] Patent Number: 6,157,538
[45] Date of Patent: Dec. 5, 2000

[54] HEAT DISSIPATION APPARATUS AND METHOD

[75] Inventors: Ihab A. Ali, San Francisco; James Hermerding; Rakesh Bhatia, both of San Jose, all of Calif.

[73] Assignee: Intel Corporation, Santa Clara, Calif.

[21] Appl. No.: 09/206,823

[22] Filed: Dec. 7, 1998

[51] Int. Cl.⁷ .................................................. H05K 7/20
[52] U.S. Cl. .................... 361/704; 361/690; 361/707; 361/710; 361/722; 361/737; 257/713; 257/717; 165/80.3; 165/185; 62/259.2; 364/708.1
[58] Field of Search ........................... 361/683, 685–694, 361/715–722, 724, 732, 737, 753, 818, 700–712, 802–816; 165/80.2, 80.3, 185, 104.33; 174/16.3, 15.2, 252, 254; 257/706–727; 62/259.2; 364/708.1

[56] References Cited

U.S. PATENT DOCUMENTS

| | | | |
|---|---|---|---|
| 4,233,645 | 11/1980 | Balderes et al. | 361/385 |
| 4,656,559 | 4/1987 | Fathi | 361/386 |
| 5,218,215 | 6/1993 | Liang et al. | 257/712 |
| 5,424,913 | 6/1995 | Swindler | 361/687 |
| 5,430,609 | 7/1995 | Kikinis | 361/711 |
| 5,528,456 | 6/1996 | Takahashi | 361/704 |
| 5,550,710 | 8/1996 | Rahamin et al. | 361/687 |
| 5,557,500 | 9/1996 | Baucom et al. | 361/687 |
| 5,590,026 | 12/1996 | Warren et al. | 361/704 |
| 5,621,615 | 4/1997 | Dawson et al. | 361/704 |
| 5,646,822 | 7/1997 | Bhatia et al. | 361/687 |
| 5,659,459 | 8/1997 | Wakabayashi et al. | 361/753 |
| 5,673,176 | 9/1997 | Penniman et al. | 361/687 |
| 5,726,858 | 3/1998 | Smith et al. | 361/705 |
| 5,729,431 | 3/1998 | Marwah et al. | 361/687 |
| 5,737,187 | 4/1998 | Nguyen et al. | 361/704 |
| 5,781,409 | 7/1998 | Mecredy | 361/700 |
| 5,784,256 | 7/1998 | Nakamura et al. | 361/699 |
| 5,790,376 | 8/1998 | Moore | 361/700 |
| 5,811,790 | 9/1998 | Endo et al. | 250/208.1 |
| 5,926,944 | 7/1999 | Smith et al. | 29/602.1 |
| 5,930,116 | 7/1999 | Palmer | 361/704 |
| 5,995,370 | 11/1999 | Nakamori | 361/704 |
| 6,002,587 | 12/1999 | Shusa et al. | 361/704 |
| 6,031,716 | 2/2000 | Cipolla et al. | 361/687 |
| 6,044,899 | 4/2000 | Langley et al. | 165/104.33 |

OTHER PUBLICATIONS

Intel Corporation, "Pentium® Processors, Heat Sink Fundamentals and Solutions," published at least as early as Dec. 3, 1998, pp. 1–5.

Rambus, Inc., "Direct Rambus™, System and Board Design Considerations," May 1998, pp. 1–3.

Rambus, Inc., "Direct Rambus™, RIMM™ Connector," Mar. 1998, pp. 1–2.

Rambus, Inc., "Direct Rambus™, RIMM™ Module, 128 MBytes (64M×16/18)," Aug. 1998, pp. 1–16.

*Primary Examiner*—Leo P. Picard
*Assistant Examiner*—Michael Datskovsky
*Attorney, Agent, or Firm*—Trop, Pruner & Hu, P.C.

[57] ABSTRACT

A system includes a housing, a support structure (e.g., a circuit board), and an electronic device mounted on the support structure. A heat dissipation apparatus is thermally coupled to the electronic device and the housing to direct heat from the electronic device into the housing. The heat dissipation apparatus may include layers of thermally conductive members coupled between the electronic device and the housing. In addition, the heat dissipation apparatus may be thermally coupled to the support structure to direct heat from the electronic device to the support structure.

16 Claims, 5 Drawing Sheets

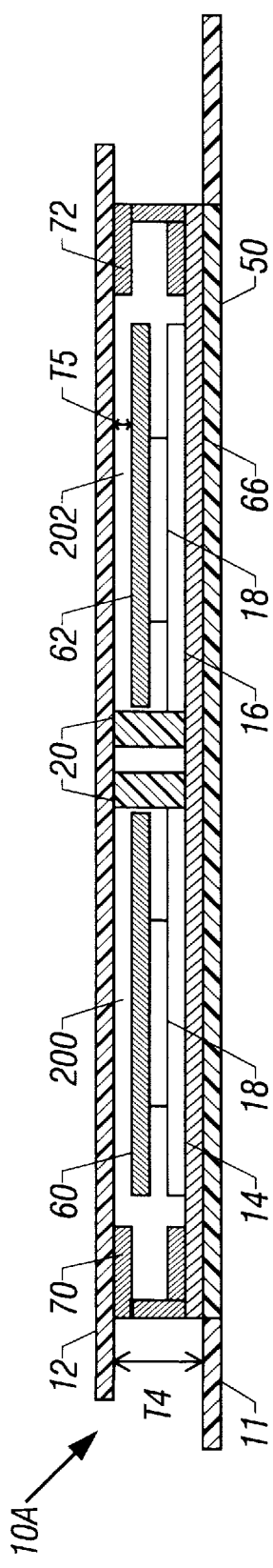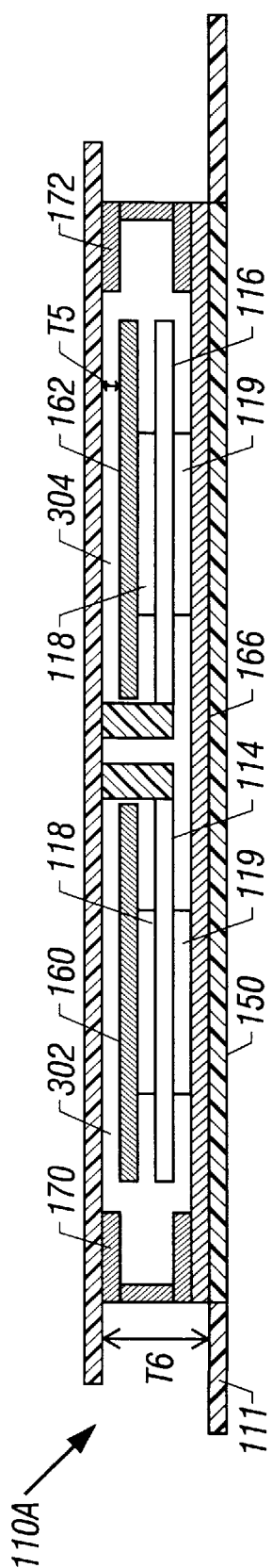

HEAT DISSIPATION APPARATUS AND METHOD

BACKGROUND

The invention relates generally to an apparatus and method to dissipate heat from electronic devices.

Various heat dissipation techniques have been utilized to remove heat generated by electronic devices in a system, such as a computer system. Such electronic devices, including for example integrated circuit devices, may be relatively dense and may operate at relatively high speeds. To prevent over-heating of these devices, a heat dissipation apparatus may be included in the system to maintain the temperature of one or more zones in the system below target temperature levels.

Both active and passive cooling devices have been implemented in systems. An active cooling device may include fans, heat exchangers, or other elements that are activated to remove heat from the system. Passive cooling devices, however, rely on heat sinks or other passive elements to remove heat from attached electronic devices. For example, high-speed microprocessors may be attached to dedicated heat sinks. In some systems, a combination of both active and passive cooling techniques may be implemented.

With the many features typically expected of systems such as computers, a large number of electronic devices may be packed into a system. This is true also of portable systems, including mobile or notebook computers, in which processing and storage capabilities have increased while their sizes have decreased. The thicknesses of such portable systems have increasingly been reduced. When components are packed into the tight spacing of a typical portable system, an active cooling technique may not be feasible due to lack of space for adequate air flow to certain parts of the system. In addition, active cooling techniques, such as fans, employ a power source for operation, which increases power consumption, which may be undesirable in a portable system that is battery-operated.

Thus, to adequately remove heat from high performance systems, improved heat dissipation techniques are needed.

SUMMARY

In general, according to one embodiment, a system includes a housing, a support structure, and an electronic device mounted on the support structure. A heat dissipation apparatus is thermally coupled to the electronic device and the housing to direct heat from the electronic device into the housing.

Other features will become apparent from the following description and from the claims.

BRIEF DESCRIPTION OF THE DRAWINGS

FIGS. 6 and 7 are cross-sectional views of heat dissipation apparatus according to further embodiments of the invention that may be used in the system of FIG. 1A.

DETAILED DESCRIPTION

In the following description, numerous details are set forth to provide an understanding of the present invention. However, it is to be understood by those skilled in the art that the present invention may be practiced without these details and that numerous variations or modifications from the described embodiments may be possible.

Figure 1A:
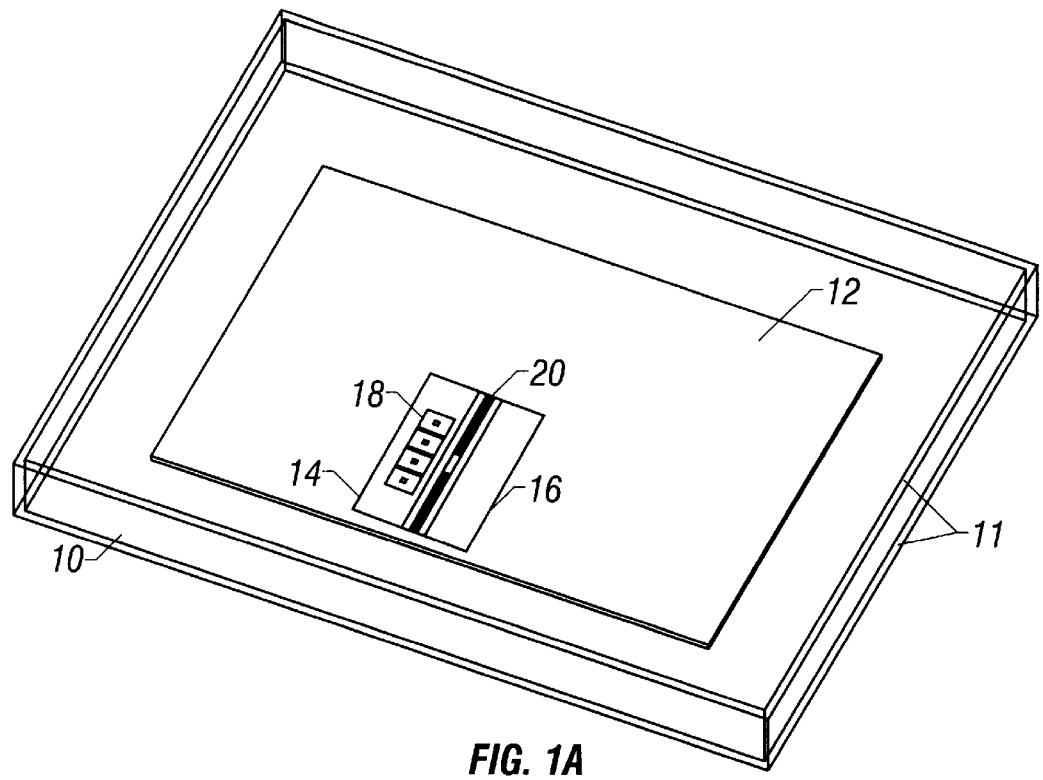
FIG. 1A illustrates an embodiment of a system having electronic devices including modules with multiple integrated circuit devices.

Referring to FIG. 1A, an embodiment of a system 10 includes a support structure 12 (e.g., a main circuit board or some other support structure) that includes a socket 20 having ports to couple to electronic devices 14 and 16. The support structure 12 and electronic devices 14 and 16 are contained within the housing 11 of the system 10. The system 10 may include, by way of example, a mobile computer, a notebook computer, a hand-held electronic device, an electronic game device, or other portable system. The support structure 12 may include motherboards, printed circuit boards, input/output cards, peripheral cards, and so forth. Electronic devices may be mounted on these support structures using a number of different mounting techniques.

In further embodiments, the socket 20 may be adapted to receive one electronic device, or the system 10 may include multiple sockets to receive additional devices. Although not shown, other electronic devices may also be mounted on the circuit board 12. In a computer, for example, electronic devices may include one or more central processing units (CPUs), memory devices, bridge controllers coupling buses, input/output (I/O) device controllers, and so forth. Further, input/output (I/O) devices may also be coupled to the one or more buses in the system.

The electronic devices 14 and 16 may include modules each including one or more integrated circuit (IC) devices, e.g., memory devices, microcontrollers, application-specific integrated circuits (ASIC), programmable gate arrays (PGAs), microprocessors, and the like. If the electronic devices 14 and 16 are memory modules, they may include various types of random access memories, such as dynamic random access memories (DRAMs), synchronous DRAMs (SDRAMs), Rambus DRAMs (RDRAMs), and static RAMs (SRAMs). Memory modules may also include non-volatile memory devices such as erasable and programmable read-only memories (EPROMs), electrically erasable and programmable read-only memories (EEPROMs), and flash memories. In one example embodiment, the modules 14 and 16 may include a direct Rambus RIMM module, as described in Direct RIM Module Advanced Information, published by Rambus, Inc. in August 1998, or in later versions. Other types of memory modules may include single in-line memory modules (SIMMs) or double in-line memory modules (DIMMs).

The electronic devices 14 and 16 also may include peripheral cards, such as cards that are coupled to primary or secondary buses in a system. Such cards may include graphics cards, audio cards, network interface cards, and so forth. In addition, in further embodiments, each electronic device 14 and 16 may include an IC device mounted directly in the socket 20 rather than on a module. In other embodiments, the electronic device 14 or 16 may include a board, module, or card having analog circuitry such as switches, relay coils, diodes, rectifiers, transformers, inductors, resistors, and capacitors.

In the ensuing description, reference is made to modules 14 and 16 as illustrated in FIG. 1A, although it is to be understood that further embodiments of the invention may be used with other electronic devices. Each module 14 and 16 in FIG. 1A has a front and a back surface with at least one of the surfaces adapted to receive IC devices. For example, with some memory modules, memory devices may be coupled to both the front and back surfaces of the modules for increased density of devices.

As illustrated, the ports of the socket 20 are positioned such that the two modules 14 and 16 are received with their front or back surfaces generally parallel to a surface of the circuit board 12. As described below, according to some embodiments, this facilitates attachment of a heat dissipation apparatus to the modules 14 and 16. It is to be understood, however, that electronic devices may be coupled in different orientations to the circuit board 12 in other embodiments of the invention.

Figure 1B:
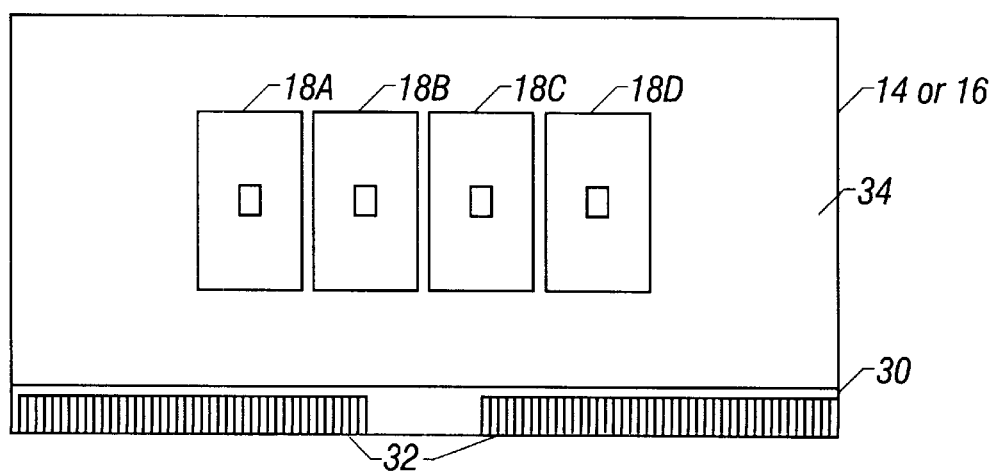
FIG. 1B is a diagram of one of the modules of FIG. 1A.

As illustrated further in FIG. 1B, each module 14 or 16 according to one embodiment includes a connector edge 30 that includes connector pins 32 for coupling to the ports in the socket 20. The module 14 or 16 may include one or more devices; in the illustrated embodiment, four devices 18A, 18B, 18C, and 18D are attached to a surface 34 of the module. According to further embodiments, devices may be placed on both surfaces (surface 34 and the surface on the back side) of the module 14 or 16 to increase the density of available devices on the module.

During operation, each of the devices 18 may be capable of producing heat. Thus, the larger the number of devices on each module 14 or 16, the greater the heat generated by the collection of devices 18. To remove the generated heat from the devices 18 on modules 14 and 16, a passive heat dissipation apparatus according to some embodiments may be attached to the devices 18 and/or modules 14 and 16.

Figure 2:
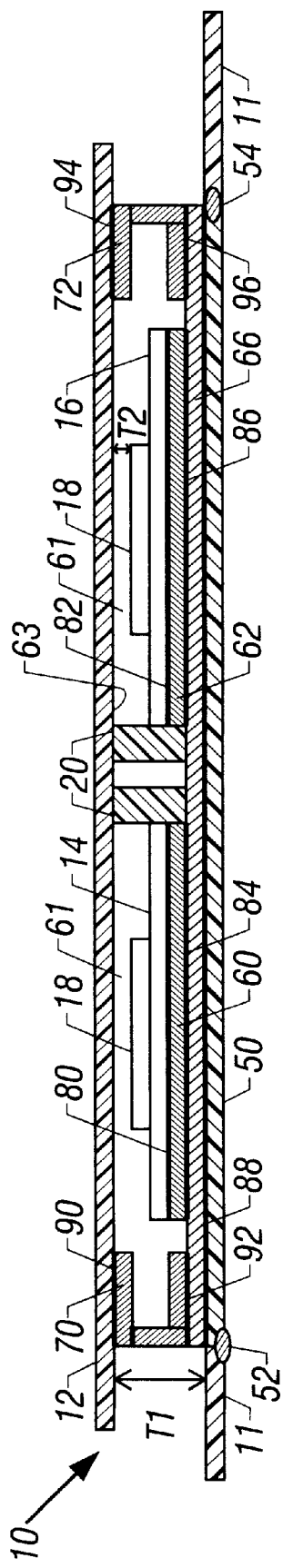
FIGS. 2 and 3 are cross-sectional views of heat dissipation apparatus according to embodiments of the invention that may be used in the system of FIG. 1A.

Referring to FIG. 2, according to one embodiment, a passive heat dissipation apparatus is coupled to surfaces of the modules 14 and 16 to draw heat from the modules and to direct the flow of heat into the housing 11 of the system 10 and into the circuit board 12. It is to be understood, however, that only one of the modules 14 and 16 may be mounted in the socket 20 in further embodiments. The passive heat dissipation apparatus includes thermally conductive plates 60 and 62 coupled to the lower surfaces of modules 14 and 16, respectively. Each of the plates 60 and 62 may be made of a material having relatively high heat conductivity, such as a material including graphite, aluminum, steel, or other like material. In the illustrated embodiment, the area of each of the plates 60 and 62 is substantially the same as the area of each of the lower surfaces of the modules 14 and 16, respectively. In other embodiments, the plates 60 and 62 may have surfaces areas smaller or larger than the surface areas of the modules 14 and 16.

A lower plate 66, which is also a thermal conductor that may be made of a material including graphite, aluminum, steel, or other like material for example, is positioned underneath the assemblies including the modules 14 and 16 and plates 60 and 62. The lower plate 66 is also positioned underneath the socket 20. The top surface of the lower plate 66 is in thermal contact with the bottom surfaces of thermally conductive plates 60 and 62. Thus, heat generated by the devices 18 on the modules 14 and 16 are directed through the modules and plates 60 and 62 to the lower conductive plate 66, which acts to distribute heat throughout the plate 66 layer.

The surface area of the lower plate 66 may be as large as space is available in the system to enhance heat dissipation. In one embodiment, the surface area of the lower plate 66 may be about the same as the circuit board 12. This is to allow heat in the lower plate 66 to be dissipated more rapidly to the housing 11 and through coupling members (as described below) to the circuit board 12. In further embodiments, the lower plate 66 may be made smaller to reduce the total weight of the system while still achieving sufficient heat dissipation.

In one embodiment, the lower plate 66 may also be attached to an access door 50 that is part of the housing 11 that may be opened or closed for access to the modules 14 and 16. For example, if the modules 14 and 16 include memory devices, the access door 50 may be opened to allow a user to upgrade memory in the system 10 by adding or replacing memory devices 18. One end of the access door 50 is attached to a hinge 54 attached to the housing 11 to allow the door to be opened and closed relatively to the housing 11, and the other end of the access door is coupled to a latch 52 attached to the housing 11 to keep the door 50 closed. The lower plate 66 is in thermal contact with the upper surface of the access door 50 (and/or some other part of the housing 11) so that heat may be dissipated to the housing of the system 10. The system housing provides a relatively large surface area to provide effective heat dissipation.

In one embodiment, thermal coupling members are positioned between the upper surface of the lower plate and a lower surface of the circuit board 12. The thermal coupling members may include brackets 70 and 72 attached to end portions of the top surface of the plate 66. In other embodiments, the brackets 70 and 72 may be positioned closer to the center of the lower plate 66. Further, the thermal coupling members may be formed of different shapes in other embodiments.

The brackets 70 and 72 provide mechanical support between the plate 66 and the circuit board 12 as well as provide a thermal conductive path between the plate 66 and the circuit board 12. The brackets 70 and 72 may be formed of a thermally conductive material that includes graphite, aluminum, steel, or other like materials, as examples.

Thermal interface materials may be formed at the contact points between the various layers in the illustrated embodiment to improve thermal conductance between the layers. The thermal interface layers may include such thermally conductive materials as thermal grease, elastomer, or some type of phase change material. In the illustrated embodiment, thermal interface layers 80 and 82 may be formed between the lower surfaces of the modules 14 and 16 and the upper surfaces of the thermal conductive plates 60 and 62, respectively. In addition, thermal interface layers 84 and 86 may be formed between the lower surfaces of the plates 60 and 62, respectively, and corresponding portions of the upper surface of the lower plate 66. A thermal interface layer 88 may also be formed between the lower surface of the plate 66 and the upper surface of the access door 50 to allow heat dissipation to the housing of the system 10 (including the access door 50). Interface layers 90, 92, 94, and 96 may also be formed at corresponding surfaces of the brackets 70 and 72 to contact upper surface portions of the plate 66 as well as lower surface portions of the circuit board 12.

In the illustrated embodiment, according to one example configuration, various thicknesses of the layers in the system 10 are provided below. It is to be understood, however, that the invention is not restricted in scope to the described thicknesses, as the thicknesses may be varied for different configurations according to further embodiments. In one example, each of the thermally conductive plates 60 and 62 may be approximately one millimeter (mm) thick. The lower plate 66 may be approximately 0.5 mm thick. An air gap 61 between the upper surface of each of the devices 18 and the lower surface 63 of the circuit board 12 may be approximately 0.1 mm thick. In the illustrated embodiment, the stack height, indicated as T1, of the modules 14 and 16 and the passive heat dissipation apparatus including thermal plates 60, 62, and 66 and brackets 70 and 72 may be approximately 3.8 mm. Such a relatively small stack height may be advantageous for applications in thin notebook computers, for example.

Although the embodiment of FIG. 2 includes electronic devices and a heat dissipation apparatus coupled underneath the main circuit board 12, the invention is not to be so limited in this respect. In other embodiments, the electronic devices and heat dissipation apparatus may be coupled above the circuit board 12 or in some other orientation relative to the circuit board 12. If the devices and heat dissipation apparatus are coupled above the circuit board 12, then the heat dissipation apparatus may be thermally coupled to the upper portion of the system housing 11. For example, if the system 10 is a mobile or notebook computer, then the heat dissipation apparatus may be coupled to the computer housing under the keyboard.

Figure 4:
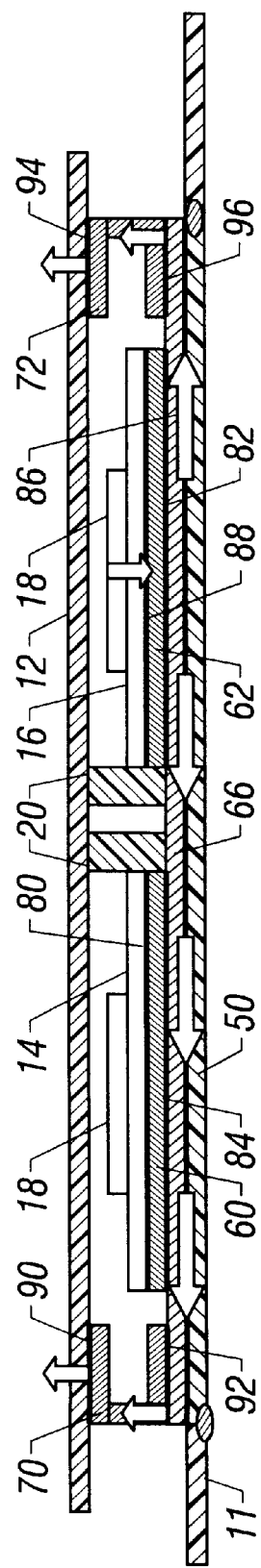
FIG. 4 illustrates heat flow through the heat dissipation apparatus of FIG. 2.

Referring further to FIG. 4, the heat flow paths are illustrated. The arrows represent the flow of heat from the devices 18 on the module 16 to the housing 11 and to the circuit board 12. As indicated, heat flows from the devices 18 through the layers including the module 16 and the thermal conductive plate 62 to the lower plate 66. Heat is then carried laterally through the plate 66 to the access door 50 and towards the brackets 70 and 72. The thermal conductive brackets 70 and 72 direct heat flow from the lower plate 66 to the circuit board 12. Thus, as illustrated, the heat dissipation apparatus directs heat to the housing of the system 10 (which includes the access door 50 in the illustrated embodiment) as well as to the circuit board 12. In an embodiment without an access door, the lower plate 66 may be coupled to the fixed housing of the system. Using the heat dissipation apparatus according to one embodiment, the temperature of the devices 18 may be kept below predetermined threshold levels, e.g., about 100° C., and the skin temperature of the outer housing 11 of the system 10 may be maintained at less than ergonomic limits, e.g., 15° to 20° C. above ambient temperature.

Figure 5:
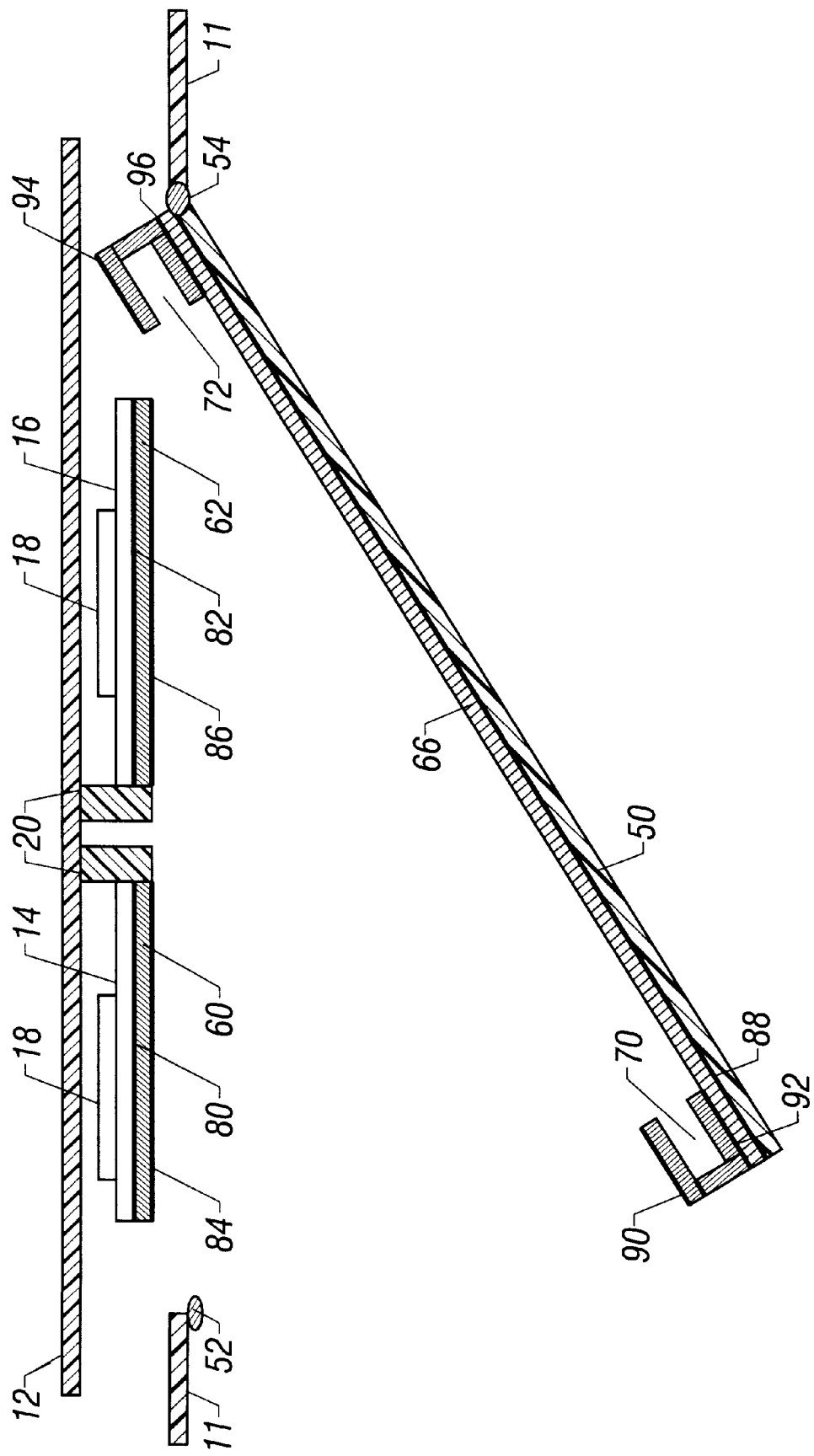
FIG. 5 illustrates the heat dissipation apparatus of FIG. 2 with an access door open.

Referring to FIG. 5, the access door 50 is shown in the pivoted open position to allow access to the modules 14 and 16. As illustrated, when the access door 50 is opened, the attached lower plate 66 and the brackets 70 and 72 are moved with the access door 50 away from the modules 14 and 16. The modules 14 and 16 along with attached thermally conductive plates 60 and 62 remain coupled to the socket 20. If desired by the user, one or both of the modules 14 and 16 may be removed from the socket 20 to upgrade or replace the devices 18.

Figure 3:
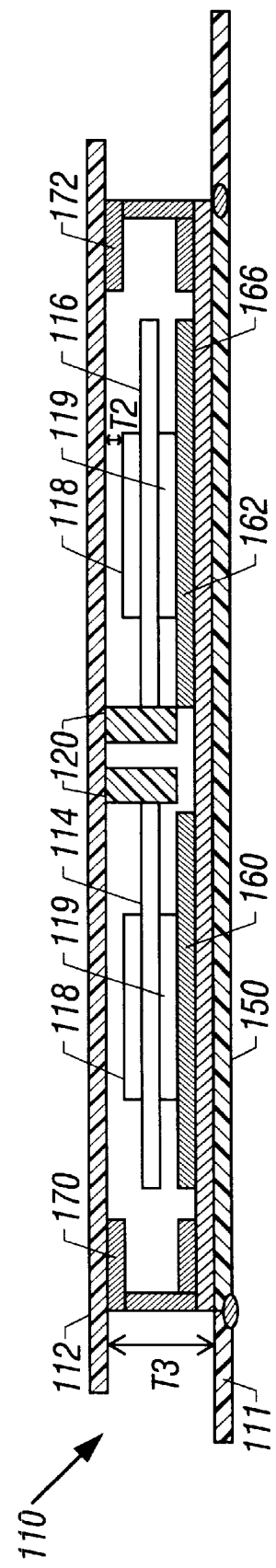

Referring to FIG. 3, according to another embodiment of the invention, the passive heat dissipation apparatus may be used with a system 110 having modules 114 and 116 with IC devices attached to both the front and back surfaces of the modules. As illustrated, devices 118 may be attached to a first surface of the modules 114 and 116, and devices 119 may be attached to second, opposite surfaces of the modules 114 and 116. To accommodate the extra devices, the system 110 may be slightly thicker than the system 10 of FIG. 2. For example, the system 110 may be a "fall-size" notebook computer in which more space is available than in a thin notebook computer.

The modules 114 and 116 are mounted in a socket 120 that is coupled to a circuit board 112. Two thermal conductive plates 160 and 162 are attached to the bottom surface of the devices 119 for transferring heat away from the assemblies including devices 118, 119, and modules 114, 116. A lower thermal conductive plate 166 is attached to both thermal conductive plates 160 and 162 and in the thermal contact with an access door 150 (and/or some other part of the housing 111) to direct heat to the housing. In addition, as in the embodiment of FIG. 2, thermally conductive brackets 170 and 172 are coupled between the thermal conductive plate 166 and the circuit board 112 to direct heat generated by devices 118 and 119 to the circuit board 112.

The layers of the various conductive plates 160, 162, and 166 may have the same thicknesses as corresponding layers 60, 62 and 66 in FIG. 2. However, because of the addition of a second layer of devices 119, the stack height, indicated as T3, of the modules and heat dissipation apparatus is larger than the stack height T1 in the embodiment of FIG. 2. In this embodiment, the stack height may be approximately 5 mm, for example.

Although not shown, thermal interface materials may be provided between the various layers in the system 110, for example, between the devices 119 and corresponding plates 160, 162; between the plates 160, 162 and the lower plate 166; between the lower plate 166 and the access door 150; between the lower plate 166 and brackets 170, 172; and between the brackets 170, 172 and the circuit board 112. The system 110 may also include the access door 150 to allow access to the modules 114 and 116.

Referring to FIG. 6, according to yet another embodiment, a modified passive heat dissipation apparatus is included in a system 10A. The system 10A in one embodiment may be the same as the system 10 of FIG. 2 except that thermally conductive plates 60 and 62 are now positioned above the IC devices 18 instead of below the bottom surfaces of the modules 14 and 16. By attaching the plates 60 and 62 on top of the devices 18, the plates 60 and 62 effectively serve as heat sinks to direct heat flow away from the devices to air in space 200 and 202. For more effective heat dissipation, the gap between the top surfaces of plate 60 and 62 and the lower surface of the circuit board 12 may be increased slightly over the gap between the top surfaces of devices 18 and the lower surface of circuit board 12 in FIG. 2. In one example, the gap, indicated as T5, may have a thickness of approximately 0.3 mm, which is an increase over the approximately 0.1-mm gap (T2) shown in the example of FIG. 2. The increased air gap allows more air to flow to enhance heat dissipation from the plates 60 and 62.

The lower side of the modules 14 and 16 may be coupled to corresponding upper surface portions of the lower plate 66. As in the embodiment of FIG. 2, thermally conductive brackets 70 and 72 or other suitable thermal coupling members may be attached to two end portions of the lower plate 66 to direct heat flow to the circuit board 12. The lower plate 66 is also in thermal contact with the access door 50 to direct heat to the housing. Although not illustrated, thermal interface layers may also be formed between the different layers shown in FIG. 6. For example, the interface material layers may be formed between the lower surface of the plates 60 and 62 and corresponding upper surfaces of devices 18. In addition, interface material layers may also be formed between the lower surfaces of the modules 14, 16 and the upper surface of the lower plate 66; between the lower plate 66 and the access door 50; between the lower plate 66 and brackets 70, 72; and between the brackets 70, 72 and the lower surface of the circuit board 12.

In one embodiment, the thicknesses of the various layers shown in FIG. 6 may be the same as the thicknesses of corresponding layers in the embodiment of FIG. 2. However, because the air gap T5 is increased, the stack height, indicated as T4, as measured from the upper surface of the housing 11 to the lower surface of the circuit board 12 may be approximately 4 mm in one example, which is approximately 0.2 mm greater than the stack height T1 of the embodiment illustrated in FIG. 2.

Referring to FIG. 7, according to a further embodiment, a system 110A may be the same as the system 110 illustrated in FIG. 3 except that the thermal conductive plates 160, 162 are placed above devices 118 rather than below devices 119. The other components of the passive heat dissipation apparatus may be similarly configured. The stack height in the embodiment of FIG. 7, indicated as T6, may be slightly increased versus the embodiment of FIG. 3 due to the increased air gap (having thickness T5, for example) in space 302 and 304. In one example, the stack height T6 may be approximately 5.2 mm.

Some embodiments of the invention may have one or more of the following advantages. The passive heat dissipation apparatus does not need to employ active components, which may be advantageous to reduce power consumption in a system, especially one that is battery-operated. In addition, the passive heat dissipation apparatus may not generate acoustical noise. The heat dissipation apparatus may be relatively inexpensive to manufacture, since it may be relatively easy to manufacture and to implement in a system. By attaching a portion of the passive heat dissipation apparatus to an access door, convenient access to electronic devices to be cooled may be available. If the modules include memory devices, for example, access may be provided through the access door to perform memory upgrade or replacement. The space employed by the passive heat dissipation apparatus according to some embodiments may be relatively small, which is advantageous in a portable system. In addition, because heat may be directed to a main circuit board in the system, the bottom skin temperature of a portable system may be kept below ergonomic limits to enhance user comfort. Because of its relative small size, the heat dissipation apparatus may be relatively light. A support mechanism may also be included in the heat dissipation apparatus to provide additional stiffness to protect against shocks and vibrations. The passive heat dissipation apparatus does not affect the socket design used to couple electronic devices to the circuit board. As a result, the heat dissipation apparatus may be applied to different types of systems, including, for example, thin notebook computers, full size notebook computers, as well as other portable and non-portable systems.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. A system comprising:
   a housing;
   a support structure having a surface;
   an electronic device mounted on the support structure, the electronic device having a first surface and a second, opposite surface, the electronic device first surface spaced apart from the support structure surface; and
   a heat dissipation apparatus having a thermally conductive layer thermally coupled to the electronic device second surface and the housing to direct heat from the electronic device into the housing, the heat dissipation apparatus further including a thermal coupling member between the layer and the support structure.

2. The system of claim 1, wherein the heat dissipation apparatus directs heat from the electronic device into the support structure.

3. The system of claim 2, wherein the support structure includes a circuit board coupled to a plurality of devices.

4. The system of claim 1, wherein the heat dissipation apparatus includes plural layers coupled between the electronic device second surface and the housing.

5. The system of claim 1, wherein the thermally conductive layer includes a first thermally conductive plate coupled to the electronic device second surface;
   wherein the thermally conductive layer further includes a second thermally conductive plate between the first conductive plate and the housing.

6. The system of claim 5, wherein the heat dissipation apparatus further includes at least another thermal coupling member between the second conductive plate and the support structure.

7. The system of claim 1, wherein the electronic device includes a module having a first surface and a second surface, the electronic device having integrated circuit devices mounted on the first and second surfaces, the heat dissipation apparatus further including a first thermally conductive plate coupled to at least to an integrated circuit device mounted on one of the first and second surfaces.

8. The system of claim 7, wherein the thermally conductive layer includes a second thermally conductive plate coupled to at least an integrated circuit device mounted on the other of the first and second surfaces.

9. The system of claim 7, wherein the thermally conductive layer includes a second thermally conductive plate coupled between the first thermally conductive plate and the housing.

10. Heat dissipation apparatus for use in a system having a housing, a circuit board and a device mounted on the circuit board, comprising:
    a thermally conductive plate thermally coupled to a first surface of the device; and
    a thermally conductive member thermally coupled between a second, opposite surface of the device and the housing to direct heat from the device to the housing, the thermally conductive member thermally contacted to the device second surface.

11. The apparatus of claim 10, further comprising a thermal coupling member between the thermally conductive member and the circuit board to direct heat from the device to the circuit board.

12. The apparatus of claim 10, further comprising a second thermally conductive plate coupled between the thermally conductive member and the housing.

13. Heat dissipation apparatus for use in a system having a housing, a circuit board and a device mounted on the circuit board, comprising:
    a first thermally conductive plate thermally coupled to a first surface of the device;
    a second thermally conductive plate thermally coupled to a second surface of the device;
    a third thermally conductive plate between the second thermally conductive plate and the housing to direct heat into the housing; and
    a thermal coupling member between the third thermally coupling plate and the circuit board to direct heat from the device to the circuit board.

14. The system of claim 5, wherein the second thermally conductive plate extends laterally beyond the first thermally conductive plate.

15. The system of claim 5, wherein the electronic device is mounted on the support structure such that a surface of the electronic device is generally parallel to a surface of the support structure.

16. The system of claim 1, further comprising an air gap, wherein the heat dissipation apparatus further includes a thermally conductive plate coupled to the electronic device first surface to direct heat from the electronic device to the air gap.

* * * * *